(12) United States Patent
Bard et al.

(10) Patent No.: US 6,553,561 B2
(45) Date of Patent: Apr. 22, 2003

(54) METHOD FOR PATTERNING A SILICON-ON-INSULATOR PHOTOMASK

(75) Inventors: Karen Ann Bard, Hopewell Junction, NY (US); Herbert Lei Ho, Cornwall, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/920,688

(22) Filed: Aug. 2, 2001

(65) Prior Publication Data

US 2003/0028855 A1 Feb. 6, 2003

(51) Int. Cl.[7] .............................................. G06F 17/50
(52) U.S. Cl. .......................................... 716/19; 716/21
(58) Field of Search ....................................... 716/1–21

(56) References Cited

U.S. PATENT DOCUMENTS

| | | | | |
|---|---|---|---|---|
| 4,688,063 A | * | 8/1987 | Lu et al. ...................... | 257/297 |
| 4,810,664 A | | 3/1989 | Kamins et al. ............... | 437/26 |
| 5,770,336 A | * | 6/1998 | Choi ........................... | 430/314 |
| 6,288,422 B1 | * | 9/2001 | Mandelman et al. ....... | 257/301 |
| 6,333,532 B1 | * | 12/2001 | Davari et al. ............... | 257/301 |
| 6,350,653 B1 | * | 2/2002 | Adkisson et al. ........... | 438/149 |

OTHER PUBLICATIONS

R. D. Goldblatt, et al., "A High Performance 0.13um Copper BEOL Technology with Low–k Dielectric", IITC 2000.
"SOI Device Structures—2.2 Wafer Fabrication", *SOI Circuit Design Concepts*, Kerry Bernstein & Norman J. Rohrer, Kluwer Academic Publisher, 2000, pp. 14–16.

* cited by examiner

Primary Examiner—Matthew Smith
Assistant Examiner—Sun James Lin
(74) Attorney, Agent, or Firm—H. Daniel Schnurmann

(57) ABSTRACT

A method for generating a patterned SOI photomask used for embedded DRAMs is described. The method systematically identifies embedded DRAM areas to be excluded from the SOI process and generates the shapes to be printed on the photomask so that the embedded DRAM may be fabricated on bulk silicon. The method includes the steps of: identifying and sorting DRAM array well shapes by common electrical net, resulting in a single array well shape for each electrical net (i.e., embedded DRAM cell). Next, all the n-band contacts touching a given array well shape are collected. These shapes are merged by common electrical net. A shape is then generated which is the smallest enclosing rectangle of the common electrical net of the n-band contact shapes. This represents the patterned SOI shape and defines the bulk areas onto which the embedded DRAM is to be built. Accordingly, the embedded DRAM macro is constructed in bulk areas while the logic is constructed in SOI.

13 Claims, 5 Drawing Sheets

STEP 1:
COLLECT ALL ARRAY WELL SHAPES

STEPS 2 AND 3:

DEFINE ARRAY WELL NET AND CREATE A
SINGLE ARRAY WELL SHAPE PER
ELECTRICAL NET

STEPS 4, 5, 6 & 7:
COLLECT ALL nWELL SHAPES.
MERGE BY ELECTRICAL NET.
CREATE n-BAND CONTACT IF THE nWELL
SHAPES TOUCH THE ARRAY WELL.

STEP 8:
GENERATE SHAPE FOR SOI PATTERNING

LEAST ENCLOSING RECTRANGLE OF n-BAND SHAPES. OUTPUT THIS SHAPE FOR A PHOTOMASK WHICH DEFINES PATTERNING FOR THE BULK AREAS ON THE SOI WAFERS

METHOD FOR PATTERNING A SILICON-ON-INSULATOR PHOTOMASK

FIELD OF THE INVENTION

This invention is related to generating a lithographic photomask and, more particularly, to an algorithm for integrating embedded DRAMs with silicon-on-insulator technology by patterning the semiconductor wafer into bulk areas for embedded DRAM processing and silicon-on-insulator areas for logic circuit processing.

BACKGROUND OF THE INVENTION

As microprocessor designs approach the 0.18 μm node and beyond, the two primary concerns that often arise are: the power consumption of the processor and the amount of on-chip memory (more commonly referred to as cache) that is required. Power consumption and the ensuing heat dissipation of the processor are a key area of interest, specially with regard to battery operated computing devices. A powerful way of reducing power consumption is to use silicon-on-insulator (SOI) wafers as substrates. As SOI wafers incorporate a buried oxide BOX) layer that is positioned underneath the active silicon region, the MOSFET junction capacitance (e.g., of source/drain diffusions) can be reduced significantly, as described, e.g., in U.S. Pat. No. 4,810,664 to Kamins et al. Thus, the voltages needed to drive devices can be lowered due to this capacitance reduction which, in turn, reduces the required power supply voltage (Vdd). The fact that SOI allows the construction of low Vt devices to maintain high logic performance is a clear advantage over that of traditional bulk silicon.

A second advantage that SOI wafers have over conventional bulk silicon wafers is the elimination of junction leakage between n-channel and p-channel devices. Ordinarily, isolated p-channel (for NFETS) and n-channel (for PFETS) "wells" or "tubs"—formed by high energy ion implantation are used to isolate devices of opposite polarity. In SOI wafers, these devices are enclosed laterally by shallow trench isolation (STI) and below by the buried oxide layer (BOX). Hence, P or N isolated wells need not to be formed. By reducing or eliminating leakage between N and P type devices, one can also reduce the power necessary to maintain isolation.

The problem of on-chip memory is one that is much more compelling and harder to solve as the memory's size is projected to grow substantially in future microprocessor designs. In many of today's microprocessors, on-chip memory is filled exclusively with Static Random Access Memory (SRAM) and take up to 50–70% of the entire microprocessor's real estate, depending on the amount of cache present on the chip. An SRAM cell is usually configured with a six transistor (6T) layout, typically four n-type Field Effect Transistors (NFETs) and two p-type FETS. The cell (or bit) size of the 6T layout is on the order of 4–6 mm$^2$ for an 0.18 μm logic generation. For subsequent logic generations, such as 0.13 μm and 0.10 μm, the cell size of the SRAM is projected to be of the order of 1 to 2 mm$^2$. As the MPU requirement of on-chip memory increases from several hundred kilobits (Kb) to several tens of megabits (Mb), the size of SRAM memory blocks presents severe manufacturing constraints due to the resultant die size. The incorporation of on-chip SRAM cache is thus limited to the range of 1–10 Mb.

The on-chip memory area crisis can be solved by replacing some, if not all the SRAM caches with a high-performance DRAM cache, hereinafter referred to as an embedded DRAM or eDRAM in short. The eDRAM cell size is approximately 6 to 8 times smaller than an SRAM having the same lithographic dimensions. Thus, it may be advantageous to replace the SRAM cache with an eDRAM cache for the same memory space on a microprocessor chip, making it possible to place more eDRAM memory than SRAM memory. Since the processor has a larger memory space to temporarily store data, the effect on the processor and system is a much improved performance.

The process of combining eDRAM caches on SOI wafers is, however, non-trivial. The major concern with integrating a high-performance DRAM cache in SOI is the effect of the floating body of the DRAM pass transistors. More particularly, since MOS transistors have their terminal entirely on an insulator, the body region under the channel is electrically isolated from the substrate and, hence, it floats with respect to the potential. Due to the fact that the body of the pass transistor is totally enclosed by oxide, the natural accumulation of holes (p-type substrate) acts negatively to the array device by creating forward bias conditions which prevents off-state conditions. This potential leakage concern with SOI on the off-state characteristics of the array device is one of the reasons why SOI wafers are currently not used for DRAMs.

In order to circumvent the deleterious effect of SOI on DRAM array devices, it has been proposed that the SOI wafer be patterned such that bulk and SOI regions be part of the same wafer. This structure is characterized by having the bulk regions reserved for the DRAM cache while the SOI wafers are used for high performance logic circuits. Such a construction providing patterned SOI wafers is also described in the aforementioned U.S. Pat. No. 4,810,664 to Kamins et al., wherein bulk regions underneath transistors also provide BOX isolation underneath the source/drain diffusions.

As will be described hereinafter, the present invention makes use of a hardmask to intentionally shield areas of the silicon substrate from the oxygen implant that is used to form the SOI. (Note: this technique of forming SOI is commonly referred to separation by implantation of oxygen, or SIMOX in short). After implanting the silicon wafer with a high dose of oxygen (–E$^{17}$/cm$^2$) at high energies (i.e., –50 to 200 KeV), the wafer is annealed at extremely high temperatures (1300° C.) to form the BOX layer and regrow single crystal silicon on top of it.

Within the context of the present invention, the BOX is formed underneath the source/drain diffusions only while leaving a bulk region for the body of the device. Herein, the body of the device is in direct contact with the substrate where it can be biased and which allows a path for holes to be "drained" into the substrate. However, this method has two potential drawbacks. First, the present invention is, most likely, limited to large transistor or gate channels on the order of 0.5 mm or greater. As the oxygen implant is usually performed at a high dose and at high energy, the lateral implantation length (commonly referred to as "straggle") of the oxygen ions will naturally go underneath the hard mask. Due to the fact that the implant is carried out at high energies, the tolerance or control of the oxygen ions progressing laterally underneath the hard mask is extremely hard to control, thus limiting the use of this invention to transistor sizes greater than 0.5 mm. The second drawback of the invention is the alignment of the transistor or gate with the substrate contact created by the pattern SIMOX. If the transistor is misaligned with respect to the substrate contact, depending how far the substrate contact is from the device, one may still be faced with a floating body effect.

A more recent method of forming pattern SOI wafers using SIMOX is described in patent applications Ser. No. 09/197,693, now issued as U.S. Pat. No. 6,353,246, and Ser. No. 09/497,124, now abandoned, respectively filed on Nov. 23, 1998 and Feb. 2, 2000, entitled "Method for filtering dislocations in merged SOI/DRAM chips". Therein is described a method of fabricating both SOI and non-SOI devices in a single semiconductor chip. Large areas of the silicon substrate are patterned so that the entire DRAM or eDRAM cache lies in the bulk region of the wafer while areas surrounding the chip lie in SOI. A hardmask process is used to pattern the large bulk areas for the DRAM or eDRAM cache while the majority of the wafer becomes SOI. Because there are bulk regions in a pattern SOI wafer for the eDRAM cache, these areas require isolated wells to be formed. In conventional bulk eDRAM CMOS, three wells are defined: an n-well onto which p-type FETs are built; a p-well onto which n-type FETs are built; and an array well (AW), which is a well with p-doping of a different concentration than the p-well, and which is used for the logic, control, sense amplifier circuits, and the like, along with all other n-type FET circuits on the semiconductor chip. The embedded DRAM array devices are all built in the way well.

In order to electrically isolate the embedded DRAM array well from adjacent wells, a band of n-doped silicon is designed to intersect the edges of the array well. This n-band surrounds the array well in a ring-like manner. Contact to the n-band is made through the n-well at the silicon surface and extends to the deep n-plate below the embedded DRAM array. Through the n-band contact, the n-band can be electrically biased.

To this effect, FIG. 1, shows a cross-section of the physical layout of a conventional embedded DRAM cell. Each cell has a trench storage capacitor. Access to the charge in the storage capacitor is controlled by biasing the NFET transistor gate and diffusion via the gate contact and diffusion contact, which is also referred to as the bit line contact. The storage capacitor is built on p-type substrate wafers. Since the transistor is an NFET, the transistor must also be fabricated onto p-doped silicon, (shown in FIG. 1 as the array well). To separate these two p-type layers, an n-band of n-type silicon is formed so that the transistor can be properly biased. The isolation shown in FIG. 1 is, typically, a shallow trench isolation which is commonly used in semiconductor processes to electrically separate devices.

FIG. 2 shows a top-down physical view of the physical layout of a corner of an embedded DRAM. The contact shown is the bit-line contact. The array well shapes define the boundary of the p-well of the DRAM. The polysilicon gate, along with the bit line contact, controls the access to the charge in the storage capacitor. The n-well shape provides a link to the deep n-type silicon for proper DRAM biasing.

OBJECTS OF THE INVENTION

Accordingly, it is an object of the present invention to provide a method for generating a patterned SOI photomask used for embedded DRAMs.

It is another object to provide a method for systematically identifying embedded DRAM areas to be excluded from the SOI process and for generating the shapes to be printed on the photomask so that the eDRAM may be fabricated on bulk silicon.

It is yet another object to provide a method for collecting all the eDRAM array well shapes and all the n-well shapes and respectively merging selected ones of these shapes into single shapes.

BRIEF DESCRIPTION OF THE DRAWINGS

The features of the invention believed to be novel and the steps characteristic of the invention are set forth with particularity in the appended claims. The figures are for illustrative purposes only and are not drawn to scale. The invention, however, both as to the organization and method of operation, may best be understood by reference to the detailed description which follows taken in conjunction with the accompanying drawings.

FIG. 4 is a pictorial representation of the various steps of the previous flow chart, wherein

SUMMARY OF THE INVENTION

Figure 1:
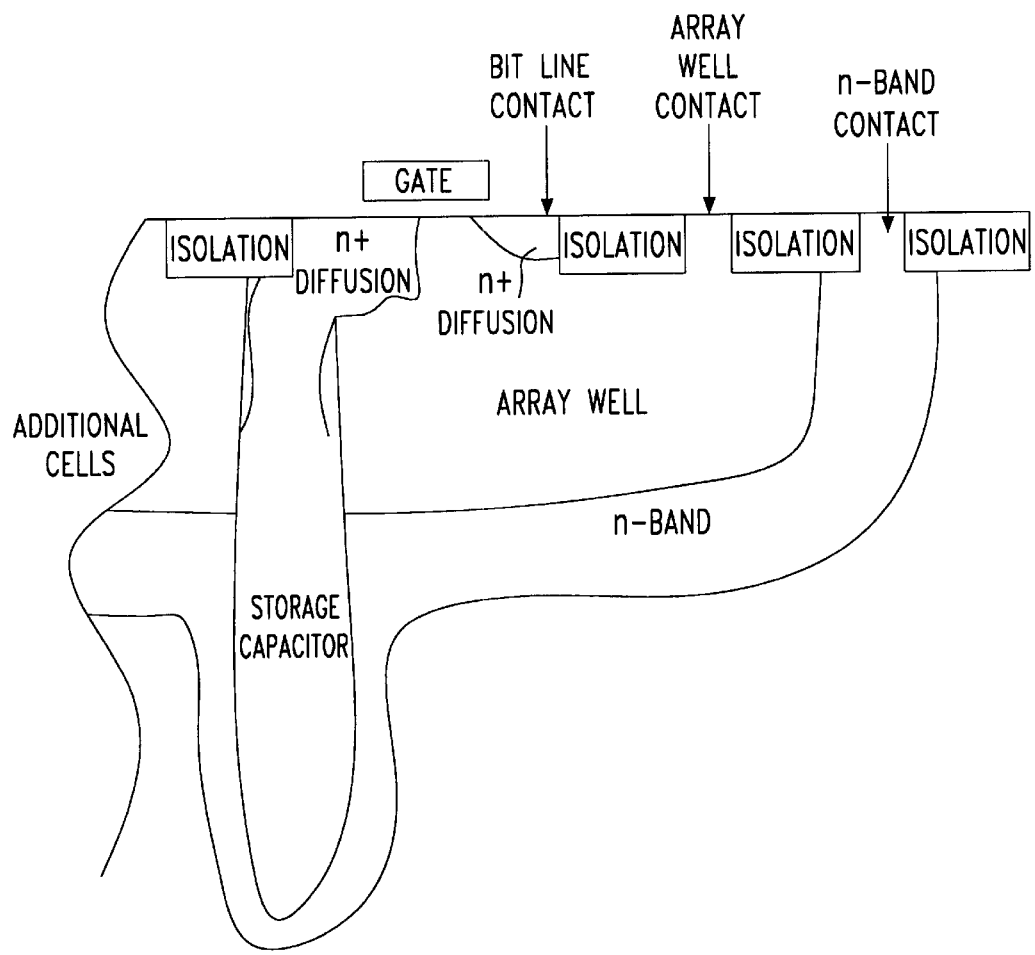
FIG. 1 is a cross-section view of a conventional embedded DRAM array corner.
Figure 2:
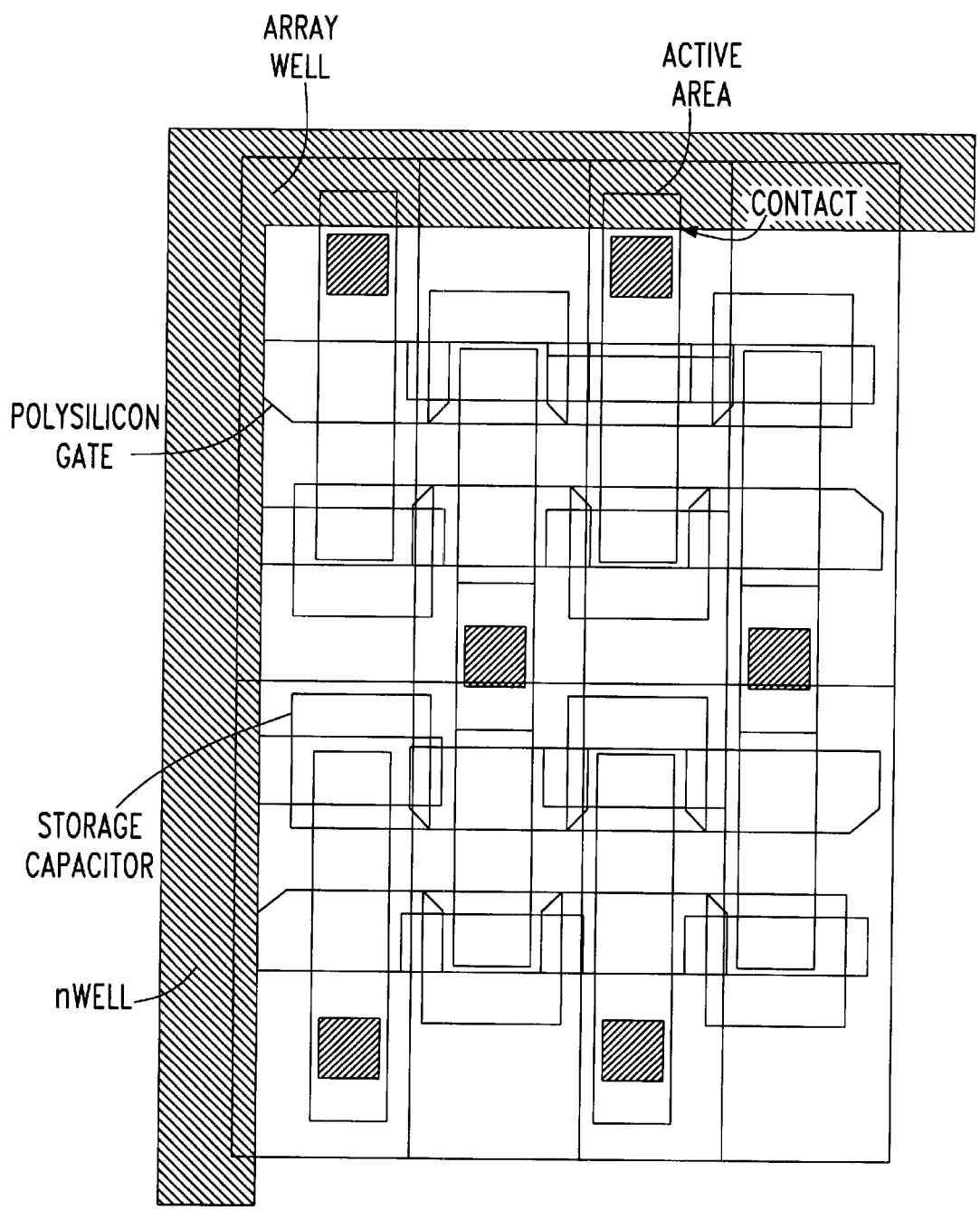
FIG. 2 shows the physical layout of the embedded DRAM of FIG. 1.

Integrating eDRAM technology with SOI technology requires patterning the SOI to avoid oxide in the eDRAM areas. The DRAM array well areas and the n-band contact shapes are used in an algorithm for generating the shapes required for patterning the photomask. Without the use of the algorithm to define the DRAM circuits and generate the patterns, manual location and layout would be required.

In a first aspect of the invention, there is provided a method that includes the steps of: identifying and collecting DRAM array well shapes by common electrical net, resulting in a single array well shape for each electrical net. Next, the n-band contacts which touch a single array well shape are collected. These shapes are sorted and merged by common electrical net. A shape is generated which is the least enclosing rectangle of the common electrical net of n-band contact shapes. This represents the patterned SOI shape and defines the bulk areas onto which the eDRAM is built. Accordingly, the eDRAM macro is constructed in bulk areas while the logic is constructed in SOI.

The algorithm first collects all the AW shapes present (step 1), then merges the AW shapes which touch another AW shape into a single polygon. The result of this operation is the identification of an AW electrical net, since each shape represents the merger of AW shapes which intersect or have a common border. The algorithm next identifies n-well shapes which touch the previously generated AW electrical net shapes. These are the n-well shapes which compose the n-band contact (steps 4, 5, 6, and 7). A single new shape, which is the smallest-enclosing rectangle of the touching n-band contacts is generated, using the layout enhancement for manufacturability programming language (step 8). This rectangle represents the output of the program. The output data is in a format suitable for photomask fabrication (steps 9 and 10).

In another aspect of the invention, there is provided a method for patterning a photomask to fabricate a silicon wafer having at least one embedded DRAM (eDRAM) that includes the steps of: collecting all the eDRAM array well shapes corresponding to individual AW electrical nets and all the n-well shapes respectively touching the AW electrical nets; respectively merging selected AW shapes and n-well shapes into individual composite shapes, and fabricating a photomask with the individual composite shapes.

DETAILED DESCRIPTION OF THE INVENTION

The algorithm described hereinafter dispenses of the need to identify individual embedded DRAM cells and to manually draw blockout area using CAD physical design layout software. Manually identifying millions of embedded dram cells and their boundaries is a time-consuming and error prone process.

The aforementioned algorithm was written in a language that belongs to a class of programs of layout enhancement for manufacturing tools. These tools are part of the semiconductor physical design verification software package which is commercially available. Operations such as shape merging, intersections to create new shapes, and other boolean operations are supported through the use of this class of software.

For better understanding the inner workings of the algorithm, FIG. 3 and FIGS. 4a–4d will be jointly described hereinafter to help visualize the process of creating a super-shape formed respectively by juxtaposing all the AWs and n-wells for a given net, namely, the eDRAM. Since it is possible to have a plurality of eDRAMs of diverse shapes and dimensions (e.g., 1 Mb and a 4 MB) within one device (i.e., chip), the program must be able to differentiate and segregate the AW shapes and the n-wells of each eDRAM.

The AW shapes which are already present in the eDRAM physical design data serve as the starting point for the algorithm. Since the only use of the AW is in the eDRAM, the presence of an AW shape is indicative of the presence of an eDRAM cell.

Figure 3:
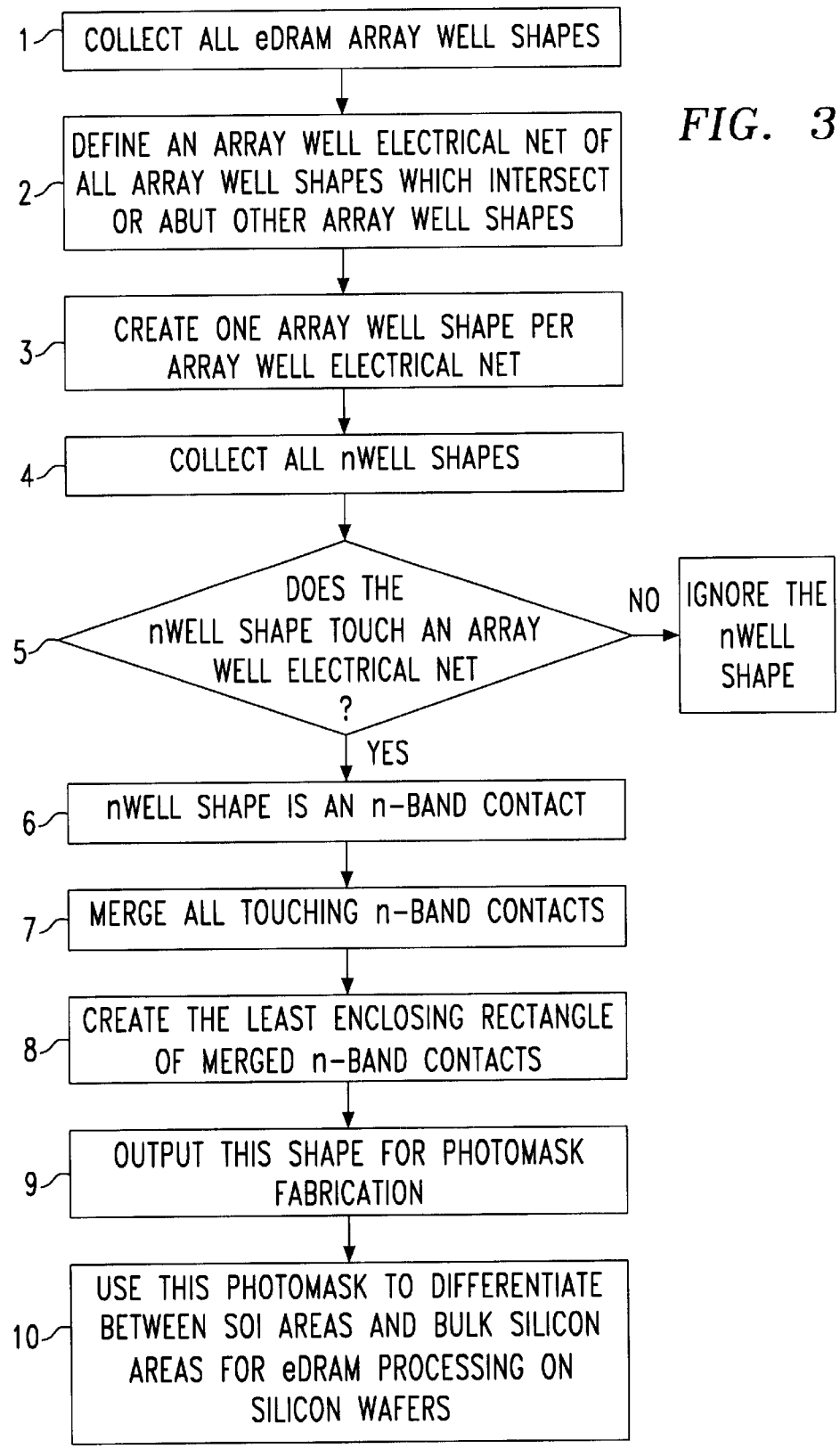
FIG. 3 is a flow chart illustrating the method steps for systematically identifying areas of the eDRAM to be included in the SOI process or included in the bulk silicon areas (i.e., excluded from the SOI process), in accordance with the present invention.
Figure 4A:
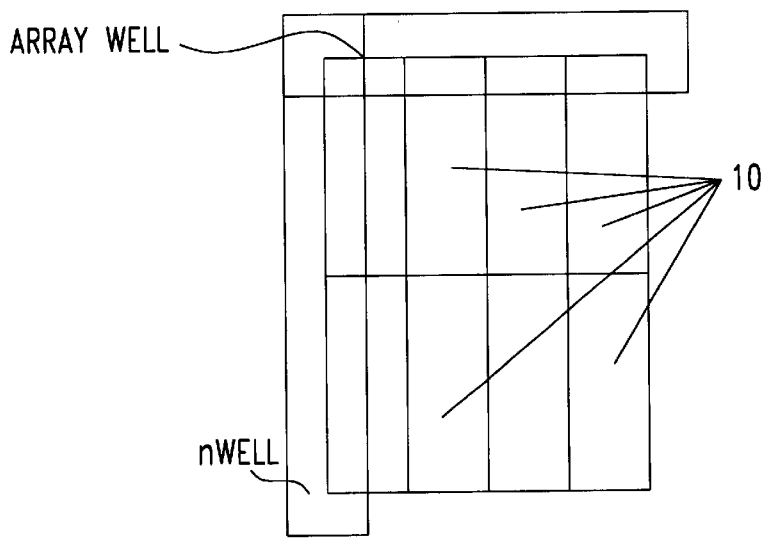
FIG. 4a illustrates the step of collecting all the array well shapes.

Referring to step 1 (FIG. 3) taken concurrently with FIG. 4a, all the AWs of all the eDRAMs are collected. A data set is formed by the individual AWs of all the eDRAM within the chip. Each array well shape is represented by a rectangle. Since, as previously mentioned, the AWs of the cells of the various eDRAMs vary (e.g., they may be part of eDRAMs of different size) the data at this step will contain AWs of different dimensions. FIG. 4a illustrates, for sake of simplicity, identical shapes belonging to one or more eDRAMs of the same size.

Since each embedded DRAM cell has an AW shape, the number of AW shapes in a design is typically on the order of millions. The algorithm first collects all the AW shapes present (step 1 of FIG. 3), then merges the AW shapes which touch another AW shape into a single polygon. The result of this operation is the identification of an AW electrical net.

Referring now to step 2 (FIG. 3) and to FIG. 4b, the algorithm classifies the AWs of each eDRAM (hereinafter referred to as an 'electrical net'). For a given electrical net, all the AWs which intersect or have a common border or which touch each other, or which start or end at other AWs are segregated into separate subsets, thereby forming a sequence of interacting AWs within the chip.

Figure 4B:
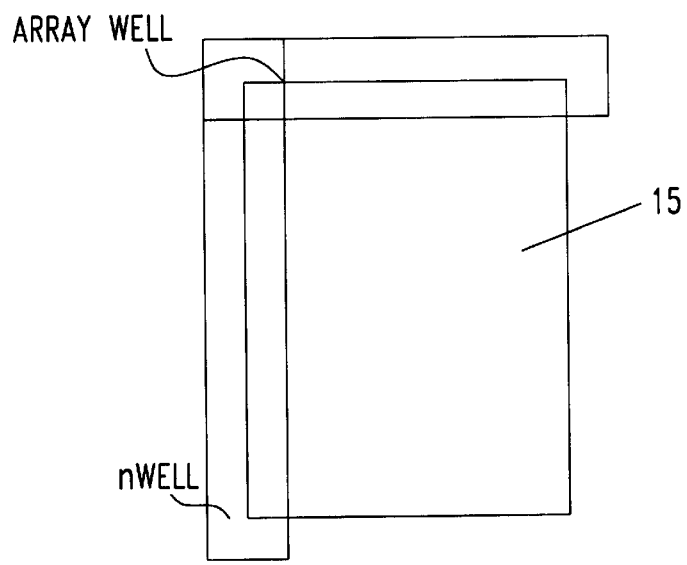
FIG. 4b shows how an array well net is defined and how a single array well shape is created for each electrical net.

Referring to step 3 (FIG. 3), shape 20 is obtained by forming an envelope 15 for all the AWs within the subset shown in FIG. 4b. Clearly since the various AWs within the subset may belong to various eDRAMs, wherein the shapes either touch or somehow interact with each other, a polygon is formed by the outer edges of the AW rectangles. For ease of manufacturability, the polygon is approximated by an envelope 15 to form the least fitting rectangle.

Figure 4C:
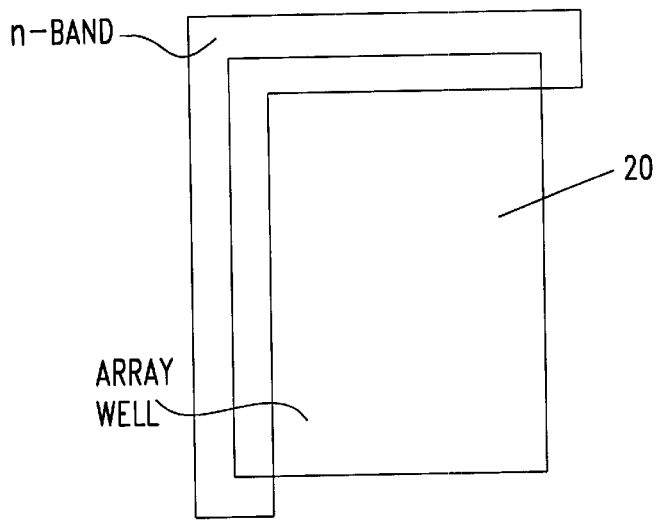
FIG. 4c depicts how n-well shapes are collected and merged by electrical net, and how n-band contacts are created when the n-well shapes touch the array well.
Figure 4D:
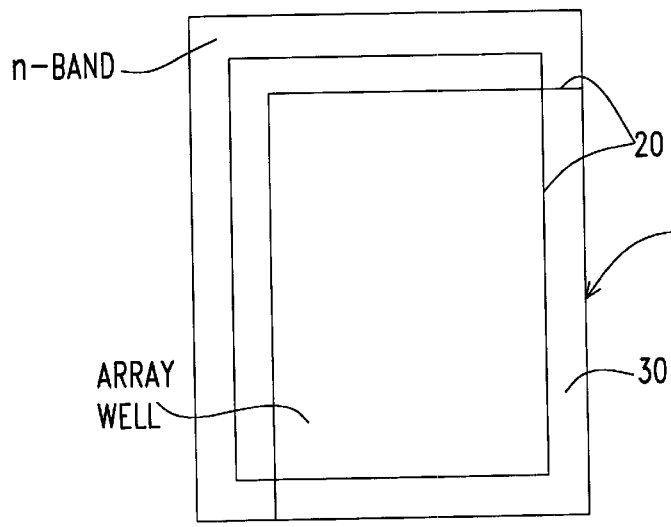
FIG. 4d shows a minimum rectangle enveloping the n-band shapes, leading to the final shape that defines the patterning process for bulk areas on SOI wafers.

A similar process is initiated for the n-wells (step 4 of FIG. 3). Referring now to FIG. 4c corresponding to steps 4–8 of FIG. 3, in step 5, the n-wells are collected in groups representing all the n-wells that touch a given AW and ignores the remaining ones. In step 6, an n-band contact is created, the n-band being defined as a set formed by all the n-well touching a given AW. In step 7, all the n-wells touching the n-band contacts are merged. As was the case for, the AWs, the various components forming a group take an irregular shape. For robustness sake, the least enclosing rectangle forming envelope 30 includes all the n-band contacts, which includes regular and irregular shapes (step 8).

The output to this process are, respectively, a regular shape of the AWs obtained while executing steps 1–3 (FIG. 3) and envelope 30 for the n-band contacts obtained by executing steps 4–8 (FIG. 3). The n-well design level is used for all n-wells in the technology. Note that the presence of an n-well shape in the physical design does not uniquely identify the shape as the array well n-band contact.

A photomask is then generated to differentiate silicon-on-insulator (SOI) regions on the semiconductor wafer from bulk silicon regions onto which the embedded DRAM is built.

It may be possible to construct eDRAM on non-patterned SOI which may require a body contact within each cell, although the present approach describes patterning SOI by blocking the electrical net oxygen implant to create bulk regions and SOI.

The present invention can be realized in hardware, software, or a combination of hardware and software. The present invention can be realized in a centralized fashion in one computer system, or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the invention has been described in conjunction with a specific best mode, it is to be understood that many alternatives, modifications and variations will be apparent to those skilled in the art in light of the aforementioned description. Accordingly, it is intended to embrace all such alternatives, modifications and variations which fall within the spirit and scope of the appended claims. All matters set forth herein or shown in the accompanying drawings are to be interpreted in an illustrative and non-limiting sense.

What is claimed is:

1. A method for patterning a photomask to fabricate a silicon wafer having at least one embedded DRAM (eDRAM) comprising the steps of:

collecting first shapes corresponding to a first set of electrical nets of said at least one eDRAM and second shapes corresponding to a second set of electrical nets of said at least one eDRAM;

merging said first and second shapes into respective individual composite shapes;

forming an enclosing rectangular envelope having the smallest possible area for each of said individual composite shapes; and fabricating the photomask with said enclosing rectangular envelopes.

2. A method for patterning a photomask to fabricate a silicon wafer having at least one embedded DRAM (eDRAM) comprising the steps of:

collecting all eDRAM array well (AW) shapes corresponding to individual AW electrical nets and all n-well shapes touching respective ones of said AW electrical nets;

merging selected ones of said AW shapes and said n-well shapes into respective individual composite shapes, and fabricating the photomask with said respective individual composite shapes.

3. The method as recited in claim 2, wherein said composite AW shape is comprised of AW shapes intersecting or having a common border with other AW shapes.

4. The method as recited in claim 2 wherein an individual AW shape is created for each of said AW electrical nets.

5. The method as recited in claim 2 wherein n-well shapes touching an AW electrical net form an n-band contact.

6. The method as recited in claim 5 wherein all of said touching n-band contacts are merged into an individual composite shape.

7. The method as recited in claim 6 wherein a least enclosing rectangle envelops said merged n-band contacts.

8. The method as recited in claim 2, wherein said photomask differentiates between silicon-on-insulator (SOI) areas from bulk silicon areas.

9. The method as recited in claim 2, wherein said AW shapes are extracted from physical design data of said eDRAM.

10. The method as recited in claim 2 wherein said AW shapes are integral of said eDRAM, each of said AW shapes identifying an eDRAM cell.

11. A method for patterning a photomask to fabricate a silicon wafer having a plurality of embedded DRAMs (eDRAM), the method comprising the steps of:

collecting array well (AW) shapes of said eDRAM;

defining an AW electrical net formed by intersecting AW shapes;

creating an AW shape for each of said AW electrical nets;

collecting all n-wells of said eDRAM;

respectively sorting said n-wells touching each of said AW shapes to define an n-band contact for each of said AW shapes;

merging all of said touching n-band contacts;

creating the least enclosing rectangle of said merged n-bands; and fabricating the photomask from said AW shapes of said AW electrical nets with said least enclosing rectangle of said merged n-bands.

12. A program storage device readable by a machine tangibly embodying a program of instructions executable by the machine to perform method steps for patterning a photomask to fabricate a silicon wafer having at least one embedded DRAM (eDRAM), the method steps comprising:

collecting first shapes corresponding to a first set of electrical nets of said at least one eDRAM and second shapes corresponding to a second set of electrical nets of said at least one eDRAM;

merging said first and second shapes into respective individual composite shapes;

forming an enclosing rectangular envelope having the smallest possible area for each of said individual composite shapes; and fabricating the photomask with said enclosing rectangular envelopes.

13. A program storage device readable by a machine, tangibly embodying a program of instructions executable by the machine to perform method steps for patterning a photomask to fabricate a silicon wafer having at least one embedded DRAM (eDRAM), the method steps comprising:

collecting all eDRAM AW shapes corresponding to individual AW electrical nets and all n-well shapes respectively touching said AW electrical nets;

merging selected ones of said AW shapes and said n-well shapes into respective individual composite shapes; and fabricating the photomask with said respective individual composite shapes.

* * * * *